US011871627B2

United States Patent
Park et al.

(10) Patent No.: US 11,871,627 B2
(45) Date of Patent: *Jan. 9, 2024

(54) DISPLAY DEVICE HAVING A LOWER PATTERN OVERLAPPING AN ACTIVE PATTERN

(71) Applicant: Samsung Display Co., LTD., Yongin-si (KR)

(72) Inventors: Jun Hyun Park, Suwon-si (KR); Kang Moon Jo, Hwaseong-si (KR); Dong Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/532,732

(22) Filed: Nov. 22, 2021

(65) Prior Publication Data

US 2022/0085137 A1 Mar. 17, 2022

Related U.S. Application Data

(63) Continuation of application No. 16/782,899, filed on Feb. 5, 2020, now Pat. No. 11,183,556.

(30) Foreign Application Priority Data

Feb. 18, 2019 (KR) .................. 10-2019-0018526

(51) Int. Cl.
*H01L 29/12* (2006.01)
*H10K 59/131* (2023.01)
(Continued)

(52) U.S. Cl.
CPC ....... *H10K 59/131* (2023.02); *H10K 59/1213* (2023.02); *H10K 59/1216* (2023.02); *H01L 27/124* (2013.01)

(58) Field of Classification Search
CPC ............. H10K 59/131; H10K 59/1213; H10K 59/1216; H01L 27/124
(Continued)

(56) References Cited

U.S. PATENT DOCUMENTS

| 6,940,568 B2 | 9/2005 | Suh |
| 10,205,051 B2 | 2/2019 | Kim et al. |

(Continued)

FOREIGN PATENT DOCUMENTS

| JP | 201677304 | 10/2016 |
| JP | 2017173505 | 9/2017 |

(Continued)

OTHER PUBLICATIONS

Korean Office Action—Korean Patent Application No. 10-2019-0018526 dated Nov. 15, 2023, citing references listed within.

*Primary Examiner* — Phuc T Dang
(74) *Attorney, Agent, or Firm* — CANTOR COLBURN LLP

(57) ABSTRACT

A display device includes: a substrate; a first conductive layer including a lower pattern disposed on the substrate; an active layer including a first active pattern disposed on the first conductive layer; and a second conductive layer including a first gate electrode disposed on the active layer, wherein the first gate electrode overlaps a first channel region included in the first active pattern, the lower pattern overlaps the first active pattern, and the first active pattern does not cross an edge of the lower pattern.

11 Claims, 14 Drawing Sheets

(51) Int. Cl.
*H10K 59/121* (2023.01)
*H01L 27/12* (2006.01)
(58) Field of Classification Search
USPC .......................................................... 257/71
See application file for complete search history.

(56) References Cited

U.S. PATENT DOCUMENTS

| | | | |
|---|---|---|---|
| 10,249,696 B2 | 4/2019 | Kim et al. | |
| 10,290,658 B2 | 5/2019 | Koo et al. | |
| 10,734,465 B2 | 8/2020 | Kim et al. | |
| 11,251,251 B2 | 2/2022 | Kim et al. | |
| 2009/0081820 A1* | 3/2009 | Park | H01L 27/1288 438/34 |
| 2013/0001601 A1* | 1/2013 | Lee | H01L 33/405 257/E33.072 |
| 2014/0284574 A1* | 9/2014 | Hong | G02F 1/13452 438/34 |
| 2015/0140699 A1* | 5/2015 | Kim | H01L 21/02488 438/23 |
| 2017/0025492 A1 | 1/2017 | Jung et al. | |
| 2018/0145123 A1 | 5/2018 | Kim et al. | |

FOREIGN PATENT DOCUMENTS

| | | |
|---|---|---|
| KR | 1020170026900 | 3/2017 |
| KR | 1020170115640 | 10/2017 |
| KR | 1020170115641 | 10/2017 |
| KR | 1020180057764 A | 5/2018 |
| KR | 1020180070334 | 6/2018 |

\* cited by examiner

DISPLAY DEVICE HAVING A LOWER PATTERN OVERLAPPING AN ACTIVE PATTERN

This application is a continuation of U.S. patent application Ser. No. 16/782,899, filed on Feb. 5, 2020, which claims priority to Korean Patent Application No. 10-2019-0018526, filed on Feb. 18, 2019, and all the benefits accruing therefrom under 35 U.S.C. § 119, the content of which in its entirety is herein incorporated by reference.

BACKGROUND

(a) Field

The disclosure relates to a display device.

(b) Description of the Related Art

A display device is a device for displaying an image, and recently, a light emitting diode display has been widely used as a self-light emission display device.

The light emitting diode display device has a self-emission characteristic and thus may not include a separate light source, differently from a liquid crystal display, so that thickness and weight thereof may be reduced. Further, the light emitting diode display device has various desired characteristics such as low power consumption, high luminance, and high response speed.

Generally, the light emitting diode display device typically includes a plurality of transistors and a plurality of light-emitting elements. In such a light emitting diode display device, the transistors are connected to signal lines and may transmit a driving current to the light-emitting elements. The transistor may include an active pattern that includes a channel region and a conductive region.

SUMMARY

This disclosure is directed to a display device in which defects in an active pattern is effectively prevented.

An exemplary embodiment of a display device according to the invention includes: a substrate; a first conductive layer including a lower pattern disposed on the substrate; an active layer including a first active pattern disposed on the first conductive layer; and a second conductive layer including a first gate electrode disposed on the active layer, wherein the first gate electrode overlaps a first channel region included in the first active pattern, the lower pattern overlaps the first active pattern, and the first active pattern does not overlap an edge of the lower pattern when viewed from a plan view in a thickness direction of the substrate.

An exemplary embodiment of a display device according to the invention includes: a first conductive layer including a conductive pattern; an active layer including a first active pattern and a second active pattern; a second conductive layer including a first gate electrode; and a third conductive layer including a capacitor electrode, where the first active pattern includes a first channel region, a first source region and a first drain region, where the first channel region overlaps the first gate electrode, the second active pattern includes a second channel region, a second source region and a second drain region, an edge of the conductive pattern encloses an edge of the first active pattern, the conductive pattern overlaps the first active pattern and does not overlap the second active pattern, and the capacitor electrode is electrically connected to the first drain region and the second source region.

An exemplary embodiment of a display device according to the invention includes: a first conductive layer including a conductive pattern; and an active layer including a first active pattern and a second active pattern which are spaced apart from each other, where the conductive pattern overlaps the first active pattern and does not overlap the second active pattern, and an edge of the conductive pattern is disposed between the first active pattern and the second active pattern.

In exemplary embodiments of the disclosure, as described herein, the defects of the active pattern of the display device may be effectively prevented.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
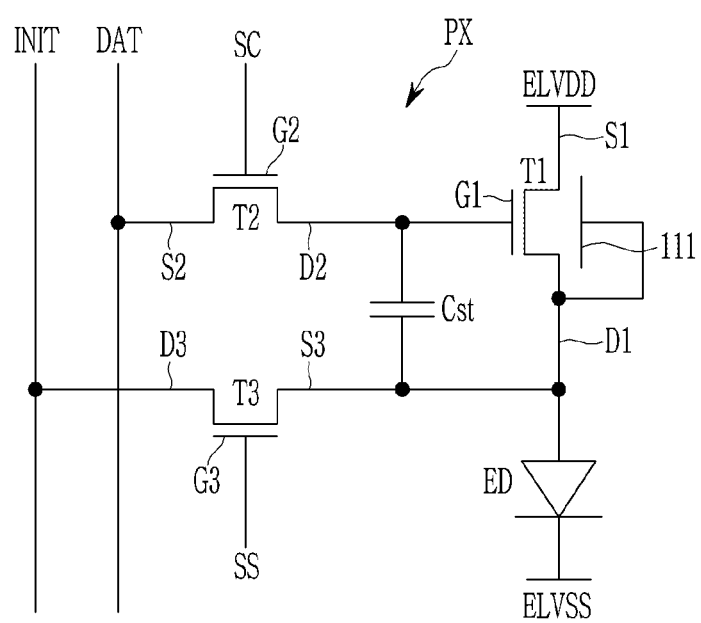
FIG. 1 is a circuit diagram of one pixel of a display device according to an exemplary embodiment of the invention.

The invention will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The drawings and description are to be regarded as illustrative in nature and not restrictive. Like reference numerals designate like elements throughout the specification.

Further, in the drawings, a size and thickness of each element are arbitrarily represented for better understanding and ease of description, and the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Throughout this specification and the claims which follow, a plan view means a view (referred to as "in a plan view") for observing a surface parallel to two directions (e.g., a first direction DR1 and a second direction DR2) crossing each other, and a cross-sectional view means a view (referred to as "in a cross-sectional view") for observing a surface cut in a direction (e.g., a third direction DR3) perpendicular to a surface parallel to the first direction and the second direction. Also, "two constituent elements overlap each other" means that the two constituent elements overlap each other in a plan view, that is, the two constituent elements overlap each other when viewed from a plan view in the third direction DR3 (e.g., a direction perpendicular to an upper surface of a substrate or a thickness direction of the substrate) unless stated otherwise.

Hereinafter, embodiments of the invention will be described in detail with reference to the accompanying drawings First, a structure of a display device according to an exemplary embodiment of the invention will be described with reference to FIG. 1.

FIG. 1 is a circuit diagram of one pixel of a display device according to an exemplary embodiment of the invention.

An exemplary embodiment of a display device according to the invention includes a plurality of pixels PX, and one pixel PX may include a plurality of transistors T1, T2 and T3, a capacitor Cst, and at least one light emitting diode ED. In such an embodiment, one pixel PX may include a single light emitting diode ED, as show in FIG. 1, but not being limited thereto.

The plurality of transistors T1, T2 and T3 includes a first transistor T1, a second transistor T2, and a third transistor T3. Source and drain electrodes described herein correspond two electrodes disposed on respective or opposing sides of a channel of each transistor T1, T2 and T3, and the terms may be interchangeably used.

In an exemplary embodiment, as shown in FIG. 1, a gate electrode G1 of the first transistor T1 is connected to one terminal of the capacitor Cst, a source electrode S1 of the first transistor T1 is connected to a driving voltage line for transmitting a driving voltage ELVDD, and a drain electrode D1 of the first transistor T1 is connected to an anode of the light emitting diode ED and the other terminal of the capacitor Cst. The first transistor T1 receives the data voltage DAT based on the switching operation of the second transistor T2, and may supply the driving current corresponding to the voltage stored in the capacitor Cst to the light emitting diode ED.

As described in greater detail below, the first transistor T1 may overlap a lower pattern 111, and the lower pattern 111 may be connected to the drain electrode D1 of the first transistor T1.

A gate electrode G2 of the second transistor T2 is connected to the first scan line for transmitting a first scan signal SC, a source electrode S2 of the second transistor T2 is connected to a data line that may transmit a data voltage DAT or a reference voltage, and a drain electrode D2 of the second transistor T2 is connected to the one terminal of the capacitor Cst and the gate electrode G1 of the first transistor T1. The second transistor T2 may be turned on in response to the first scan signal SC to transfer the reference voltage or the data voltage DAT to the gate electrode G1 of the first transistor T1 and the one terminal of the capacitor Cst.

A gate electrode G3 of the third transistor T3 is connected to the second scan line for transmitting a second scan signal SS, a source electrode S3 of the third transistor T3 is connected to the other terminal of the capacitor Cst, the drain electrode D1 of the first transistor T1 and the anode of the light emitting diode ED, and a drain electrode D3 of the third transistor T3 is connected to an initialization voltage line to which the initialization voltage INIT is applied. The third transistor T3 is turned on in response to the second scan signal SS such that the initialization voltage INIT may be transferred to the other terminal of the capacitor Cst and the anode of the light emitting diode ED to initialize the anode voltage of the light emitting diode ED.

The one terminal of the capacitor Cst is connected to the gate electrode G1 of the first transistor T1, and the other terminal of the capacitor Cst is connected to the anode of the light emitting diode ED and the source electrode S3 of the third transistor T3. The cathode of the light emitting diode ED is connected to a common voltage line that transfers a common voltage ELVSS.

The light emitting diode ED may emit light with a luminance corresponding to the driving current generated by the first transistor T1.

Hereinafter, an operation of an exemplary embodiment of the pixel shown in FIG. 1, particularly the operation thereof during one frame, will be described. In such an embodiment, the transistors T1, T2, and T3 may be N-type channel transistors, but not being limited thereto.

When a frame starts, the first scan signal SC of a high level and the second scan signal SS of the high level are supplied to the pixel in a initialization period, and the second transistor T2 and the third transistor T3 are thereby turned on. The reference voltage from the data line is supplied to the one terminal of the capacitor Cst and the gate electrode G1 of the first transistor T1 through the second transistor T2 which is turned on, and the initialization voltage INIT is supplied to the drain electrode D1 of the first transistor T1 and the anode of the light emitting diode ED through the third transistor T3 which is turned on. Accordingly, during the initialization period, the drain electrode D1 of the first transistor T1 and the anode of the light emitting diode ED are initialized into the initialization voltage INIT. In this case, a voltage corresponding to the difference between the reference voltage and the initialization voltage INIT is stored in the capacitor Cst.

Next, in a sensing period, when the second scan signal SS becomes the low level while the first scan signal SC of the high level is maintained, the second transistor T2 maintains the turn-on state and the third transistor T3 is turned off. The gate electrode G1 of the first transistor T1 and the one terminal of the capacitor Cst is maintained at the reference voltage through the turned-on second transistor T2, and the drain electrode D1 of the first transistor T1 and the anode of the light emitting diode ED are disconnected from the initialization voltage INIT through the turned-off third transistor T3. Thus, the first transistor T1 allows a current to flow from the source electrode S1 to the drain electrode D1 and then is turned off when the voltage of the drain electrode D1 becomes a voltage obtained by subtracting a threshold voltage (Vth) from the reference voltage. Herein, Vth represents the threshold voltage of the first transistor T1. At this time, the voltage difference between the gate electrode G1 and the drain electrode D1 of the first transistor T1 is stored in the capacitor Cst, and the threshold voltage Vth of the first transistor T1 may be sensed. By generating the data signal that is compensated based on the sensed characteristic information of the first transistor T1, e.g., the threshold voltage Vth, during the sensing period, a characteristic deviation of first transistor T1, which may be different in each pixel, may be externally compensated.

Next, in a data input period, when the first scan signal SC of a high level is supplied and the second scan signal SS of a low level is supplied, the second transistor T2 is turned on and the third transistor T3 is turned off. The data voltage DAT from the data line is supplied to the one terminal of the capacitor Cst and the gate electrode G1 of the first transistor T1 via the turned-on second transistor T2. In this case, the anode of the drain electrode D1 and the light emitting diode ED of the first transistor T1 may be substantially maintained at the potential thereof in the sensing period by the first transistor T1 in the turn-off state.

Next, in a light emission period, the first transistor T1 that is turned on by the data voltage DAT transmitted to the gate electrode G1 generates the driving current corresponding to the data voltage DAT, and the light emitting diode ED may emit light based on the driving current.

The detailed structure of an exemplary embodiment of the display device according to the invention will now be described with reference to FIG. 2 to FIG. 5 along with FIG. 1.

Figure 2:
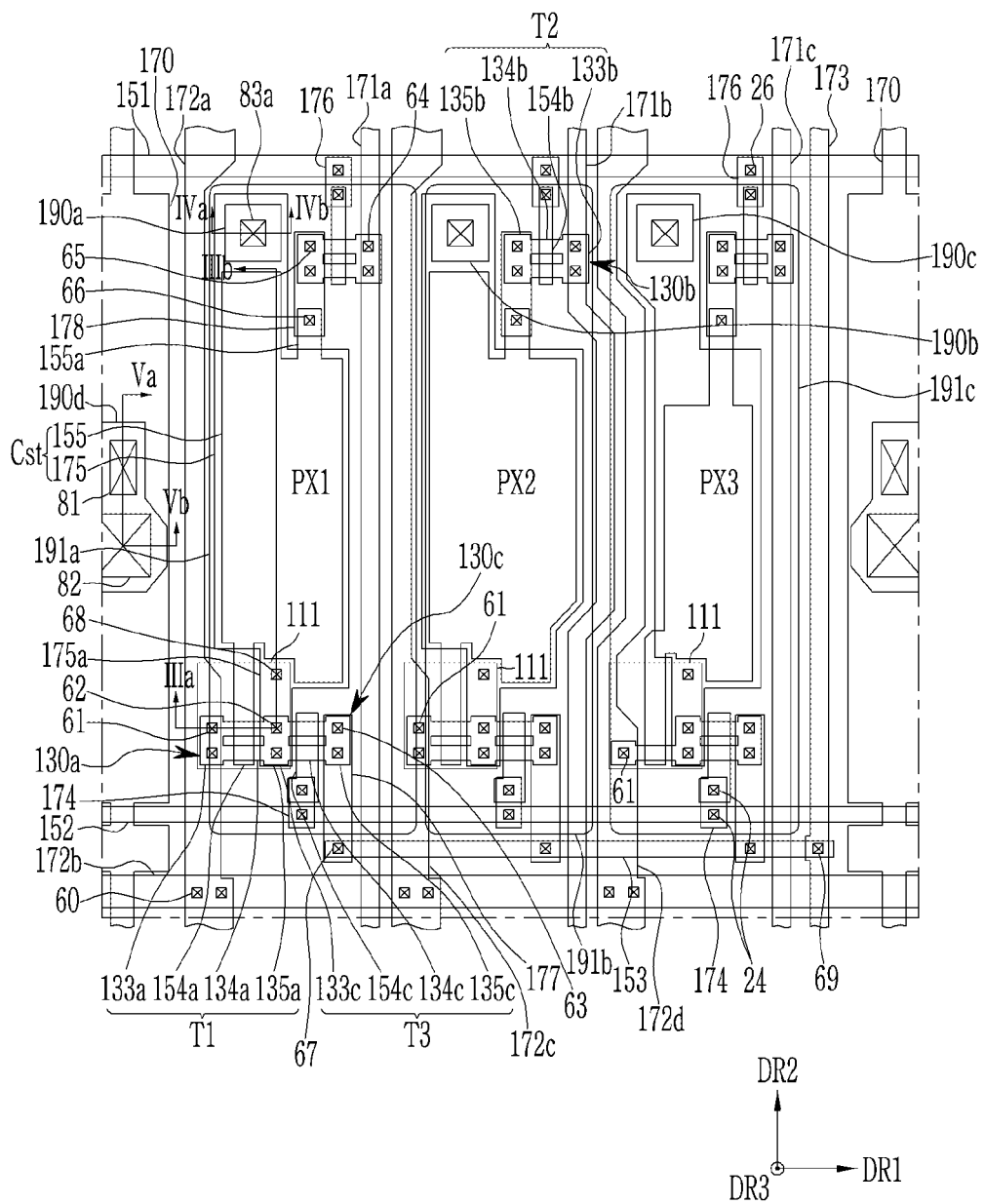
FIG. 2 is a plan view of a plurality of pixels of a display device according to an exemplary embodiment of the invention.
Figure 3:
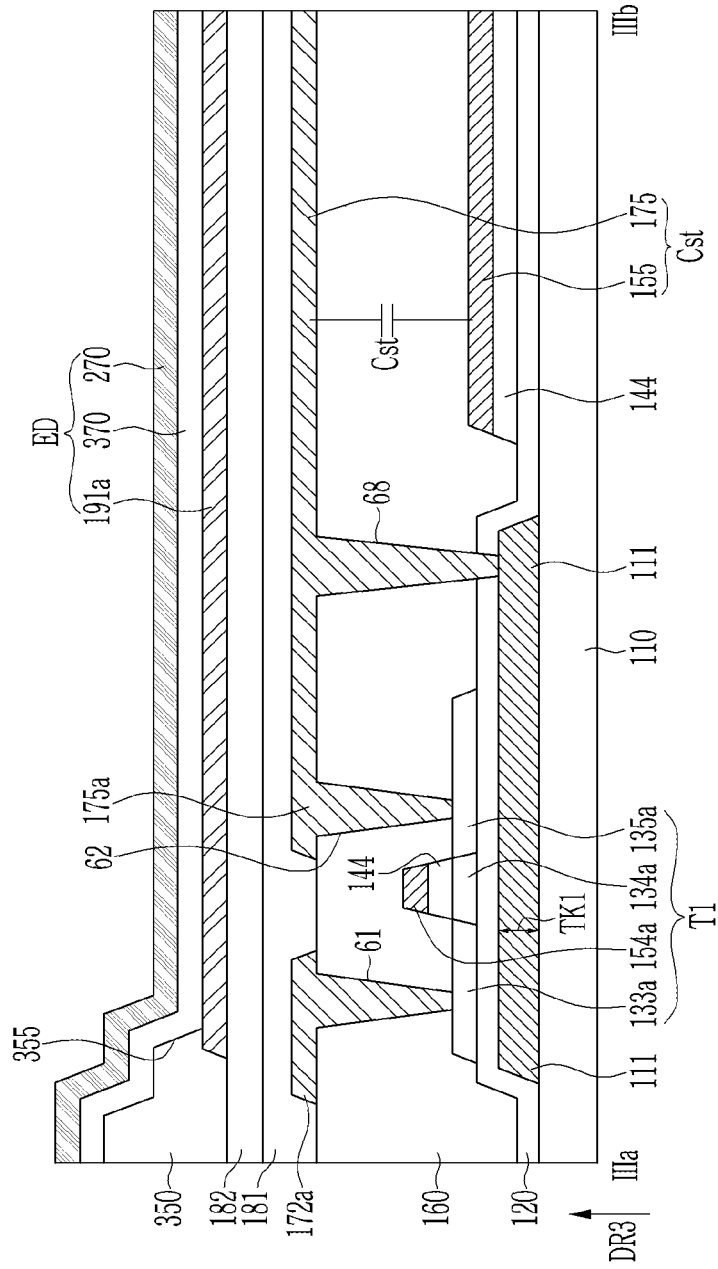
FIG. 3 is a cross-sectional view taken along line IIIa-IIIb of a display device shown in FIG. 2.
Figure 4:
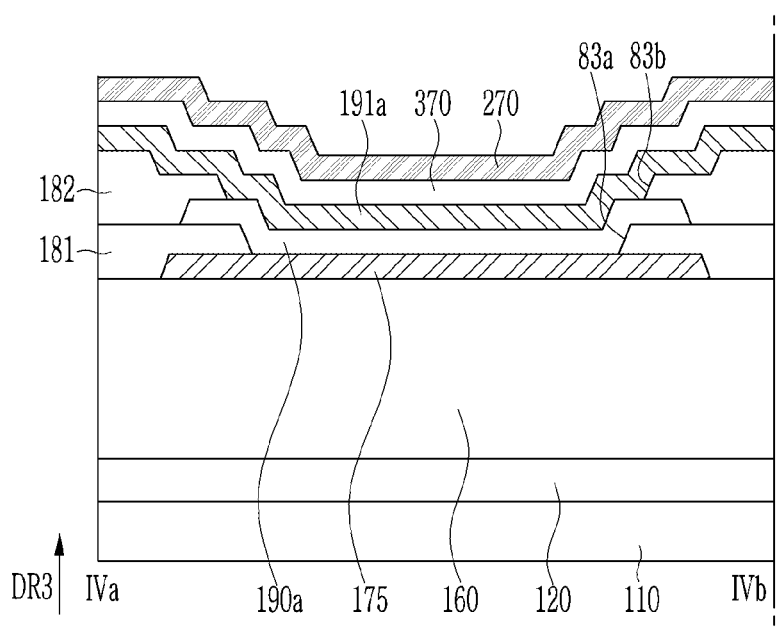
FIG. 4 is a cross-sectional view taken along line IVa-IVb shown in FIG. 2.
Figure 5:
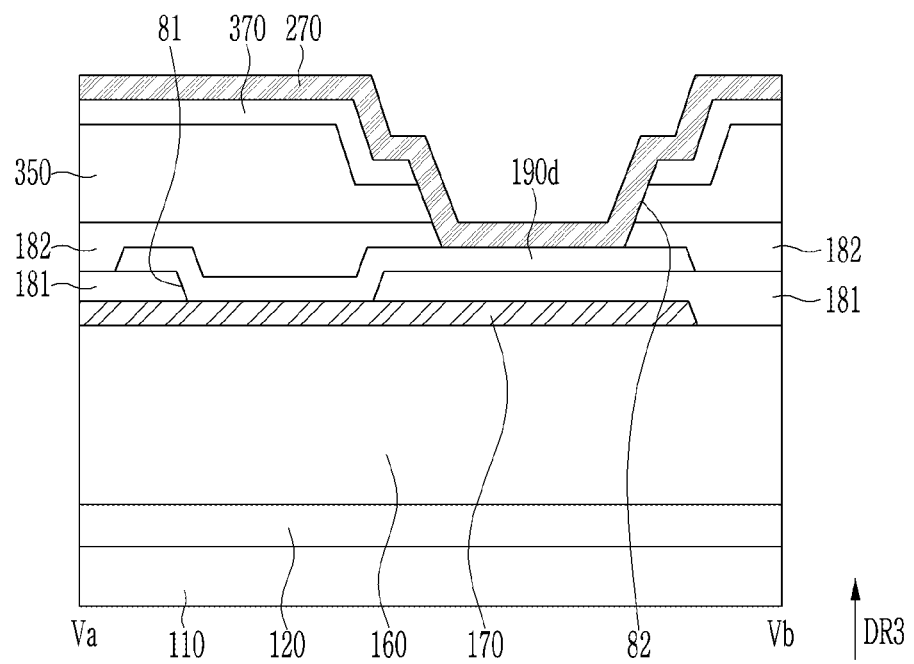
FIG. 5 is a cross-sectional view taken along line Va-Vb shown in FIG. 2.

FIG. 2 is a plan view of a plurality of pixels of a display device according to an exemplary embodiment of the invention, FIG. 3 is a cross-sectional view taken along line IIIa-IIIb of a display device shown in FIG. 2, FIG. 4 is a cross-sectional view taken along line IVa-IVb of a display device shown in FIG. 2, and FIG. 5 is a cross-sectional view taken along line Va-Vb of a display device shown in FIG. 2. FIG. 2 shows the plan structure of three pixels PX1, PX2 and PX3 adjacent to each other, and since each pixel PX1, PX2 or PX3 includes constituent elements corresponding to each other, the reference numerals of any one pixel PX1, PX2 or PX3 may be equally applied to the corresponding constituent elements of the other pixels PX1, PX2 and PX3.

An exemplary embodiment of the display device may include a substrate 110. The substrate 110 may include an insulating material such as a glass, a plastic, etc., and may have flexibility.

A lower layer (or a first conductive layer) including a plurality of lower patterns 111 may be disposed on the substrate 110. A lower pattern is also referred to as a conductive pattern. The lower layer may include at least one selected from various conductive metals or a semiconductor material having a conductive characteristic equivalent thereto.

In an exemplary embodiment, as shown in FIG. 3, a thickness of TK1 of the lower pattern 111 in a third direction DR3 may be in a range from several hundreds of angstroms to several thousands of angstroms. In one exemplary embodiment, for example, the thickness TK1 of the lower pattern 111 in the third direction DR3 may be in a range from about 500 angstroms to less than 4000 angstroms.

A buffer layer 120, which is an insulating layer, is disposed on the lower layer.

An active layer including a plurality of active patterns 130a, 130b and 130c is disposed on the buffer layer 120. In such an embodiment, the lower layer may be disposed between the substrate 110 and the active layer. Each of the active patterns 130a, 130b and 130c disposed in each pixel PX1, PX2 or PX3 may include a channel region 134a, 134b and 134c that defines a channel of each of the plurality of transistors T1, T2, and T3 described above, and a conductive region connected thereto. The conductive region of each of the active patterns 130a, 130b or 130c may include a source region 133a, 133b or 133c and a drain region 135a, 135b or 135c of each transistor T1, T2 or T3.

In each pixel PX1, PX2 or PX3, the active pattern 130a and the active pattern 130c may be connected to each other or separated from each other. FIG. 2 shows an exemplary embodiment in which the active pattern 130a and the active pattern 130c are connected to each other. In such an embodiment, the drain region 135a of the active pattern 130a may be the source region 133c of the active pattern 130c.

The active layer may include a semiconductor material such as an amorphous silicon, a polysilicon, or an oxide semiconductor.

The thickness of the active layer in the third direction DR3 may be less than the thickness TK1 of the lower pattern 111 and may be, for example, several hundred angstroms. In one exemplary embodiment, for example, the thickness range of the third direction DR3 of the active layer may be in a range of about 300 angstroms to about 500 angstroms, but not being limited thereto.

An insulating pattern 144 of a first insulating layer may be disposed on the active layer. The insulating pattern 144 may overlap the channel regions 134a, 134b and 134c of the active patterns 130a, 130b and 130c, and may be disposed on the channel regions 134a, 134b and 134c. The insulating pattern 144 may not substantially overlap the conductive regions of the active patterns 130a, 130b and 130c.

A second conductive layer may be disposed on the insulating pattern 144. The second conductive layer may include a first scan line 151 that may transmit the first scan signal SC described above, a second scan line 152 that may transmit the second scan signal SS, a transverse initialization voltage line 153 that may transmit the initialization voltage INIT, a transverse driving voltage line 172b that may transmit the driving voltage ELVDD, a driving gate electrode 155, a second gate electrode 154b, and a third gate electrode 154c. The gate electrode G1, the gate electrode G2 and the gate electrode G3 in the above-described circuit diagram may respectively correspond to a first gate electrode 154a, the second gate electrode 154b and the third gate electrode 154c defined by portions of the driving gate electrode 155.

The first and second scan lines 151 and 152, the transverse initialization voltage line 153, and the transverse driving voltage line 172b may extend in the first direction DR1, respectively.

In a plan view, the driving gate electrode 155 may be disposed between the first scan line 151 and the second scan line 152.

The second gate electrode 154b is spaced apart from the first scan line 151 and may approximately extend in a second direction DR2. Alternatively, the second gate electrode 154b may be directly connected to the first scan line 151.

The third gate electrode 154c is spaced apart from the second scan line 152, and may approximately extend in the second direction DR2. Alternatively, the third gate electrode 154c may be directly connected to the second scan line 152.

The driving gate electrode 155 disposed in each pixel PX1, PX2 or PX3 may include a protrusion 155a protruded upward and the first gate electrode 154a downward approximately extending in the second direction DR2.

The first gate electrode 154a crosses the active pattern 130a and overlaps the channel region 134a of the active pattern 130a. The second gate electrode 154b crosses the active pattern 130b and overlaps the channel region 134b of the active pattern 130b. The third gate electrode 154c crosses the active pattern 130c and overlaps the channel region 134c of the active pattern 130c.

A second insulating layer 160 may be disposed on the second conductive layer. A plurality of contact holes 24, 26, 60, 61, 62, 63, 64, 65, 66, 67, 68 and 69 may be defined through the buffer layer 120 and/or the second insulating layer 160.

A third conductive layer may be disposed on the second insulating layer 160. The third conductive layer may include a plurality of data lines 171a, 171b and 171c, a plurality of driving voltage lines 172a, 172c and 172d, a common voltage line 170, an initialization voltage line 173, a capacitor electrode 175, and a plurality of connecting members 174, 176, 177 and 178.

In a plan view, the data lines 171a, 171b and 171c, the driving voltage lines 172a, 172c and 172d, the common voltage line 170, and the initialization voltage line 173 may respectively approximately extend in the second direction DR2, and cross the first scan line 151 and the second scan line 152.

The plurality of pixels PX1, PX2 and PX3 of a pixel group (or a pixel unit) shown in FIG. 2 may be arranged in the first direction DR1 and adjacent to each other, and may be repeatedly disposed in the first direction DR1 and the second direction DR2. The common voltage line 170 may be respectively disposed on the left side and right side of the plurality of pixels PX1, PX2 and PX3 of one group. In an exemplary embodiment, where the plurality of pixels PX1, PX2 and PX3 in the repeated group includes three pixels PX1, PX2 and PX3 as shown in FIG. 2, three data lines 171a, 171b and 171c, and three driving voltage lines 172a, 172c and 172d, and at least one initialization voltage line 173 may be disposed between two adjacent common voltage lines 170.

Each data line 171a, 171b or 171c is electrically connected to the source region 133b of the active pattern 130b through the contact hole 64 of the second insulating layer 160 (e.g., two contact holes 64 defined in each pixel PX1, PX2 or PX3 as shown in FIG. 2).

Each driving voltage line 172a, 172c or 172d may be disposed corresponding to each pixel PX1, PX2 or PX3.

Each driving voltage line 172a, 172c or 172d is electrically connected to the source region 133a of the active pattern 130a through the contact hole 61 of the second insulating layer 160 (e.g., two contact holes 61 defined in the pixels PX1 and PX2 and one contact hole 61 defined in the pixel PX3 as shown in FIG. 2). In such an embodiment, the driving voltage lines 172a, 172c and 172d are electrically connected to the transverse driving voltage line 172b through the contact hole 60 of the second insulating layer 160. Thus, the transverse driving voltage line 172b may transmit the driving voltage along with the driving voltage lines 172a, 172c and 172d, and the driving voltage is transmitted in both of the first direction DR1 and the second direction DR2, e.g., in a mesh shape, across the entire display device.

The initialization voltage line 173 is electrically connected to the transverse initialization voltage line 153 through the contact hole 69 of the second insulating layer 160. Thus, in an exemplary embodiment, where even a single initialization voltage line 173 is provided for three pixels PX1, PX2 and PX3, the transverse initialization voltage line 153 may transmit the initialization voltage along with the initialization voltage line 173, and the initialization voltage may be transmitted to all three pixels PX1, PX2, and PX3 through the transverse initialization voltage line 153. A capacitor electrode 175 (e.g., a single capacitor electrode) may be disposed in each pixel PX1, PX2 or PX3.

The capacitor electrode 175 may overlap the corresponding driving gate electrode 155 via the second insulating layer 160 therebetween, thereby forming the capacitor Cst.

The capacitor electrode 175 may include a protrusion 175a downwardly extended therefrom. The protrusion 175a is electrically connected to the drain region 135a of the active pattern 130a (or the source region 133c of the active pattern 130c) through the contact hole 62 of the second insulating layer 160 (e.g., two contact holes 62 defined at each pixel PX1, PX2 or PX3 as shown in FIG. 2). In such an embodiment, as shown in FIG. 3, the capacitor electrode 175 is electrically connected to the lower pattern 111 through the contact hole 68 defined through the second insulating layer 160 and the buffer layer 120. The connecting member 174 may be electrically connected to the second scan line 152 and the third gate electrode 154c through the contact hole 24 of the second insulating layer 160 to electrically connect the second scan line 152 and the third gate electrode 154c to each other.

The connecting member 176 may be electrically connected to the first scan line 151 and the second gate electrode 154b through the contact hole 26 of the second insulating layer 160 to electrically connect the first scan line 151 and the second gate electrode 154b to each other.

In each pixel PX1, PX2 or PX3, the connecting member 177 is electrically connected to the drain region 135c of the active pattern 130c through the contact hole 63 of the second insulating layer 160 (e.g., two contact holes 63 defined at each pixel PX1, PX2 or PX3 as shown in FIG. 2) and electrically connected to the transverse initialization voltage line 153 through the contact hole 67 of the second insulating layer 160, such that the drain region 135c of the active pattern 130c may be electrically connected to the transverse initialization voltage line 153.

The transverse initialization voltage line 153 extends in the first direction DR1 across three pixels PX1, PX2, and PX3, and may be disposed between two adjacent common voltage lines 170, such that the transverse initialization voltage line 153 may not cross (or overlap) the two adjacent common voltage lines 170. The transverse initialization voltage line 153 crosses three adjacent data lines 171a, 171b and 171c, and may extend only to the initialization voltage line 173.

The connecting member 178 is electrically connected to the drain region 135b of the active pattern 130b in each pixel PX1, PX2 or PX3 through the contact hole 65 (e.g., two contact holes 65 defined in each pixel PX1, PX2 or PX3 as shown in FIG. 2) of the second insulating layer 160 and is electrically connected to the protrusion 155a of the driving gate electrode 155 through the contact hole 66 of the second insulating layer 160, such that the drain region 135b of the active pattern 130b and the protrusion 155a of the driving gate electrode 155 may be electrically connected to each other.

At least one of the first conductive layer, the second conductive layer, and the third conductive layer include or is made of at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta) and a combination (e.g., an alloy) thereof. Each of the first conductive layer, the second conductive layer and the third conductive layer may have a single-layer structure or a multi-layer structure. In one exemplary embodiment, for example, the third conductive layer may have a multilayer structure including an underlying layer including titanium and an overlying layer including copper.

The first transistor T1 includes the channel region 134a, the source region 133a, the drain region 135a, and the first gate electrode 154a. The source region 133a of the first transistor T1 is electrically connected to a corresponding driving voltage line 172a, 172c or 172d, thereby receiving the driving voltage.

The lower pattern 111 corresponding to the first transistor T1 overlaps the channel region 134a between the channel region 134a of the first transistor T1 and the substrate 110 to prevent external light from reaching the channel region 134a, thereby reducing a leakage current and a characteristic deterioration. The lower pattern 111 is electrically connected to the drain region 135a of the first transistor T1 via the capacitor electrode 175.

The second transistor T2 includes the channel region 134b, the source region 133b, the drain region 135b, and the second gate electrode 154b. The source region 133b of the second transistor T2 is electrically connected to a corresponding data line 171a, 171b or 171c, thereby receiving the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive the initialization voltage through the transverse initialization voltage line 153.

A third insulating layer 181 may be disposed on the second insulating layer 160 and the third conductive layer. A contact hole 83a may be defined through the third insulating layer 181 to overlap the capacitor electrode 175 as shown in FIG. 4, and a contact hole 81 may be defined through the third insulating layer 181 to overlap the common voltage line 170 as shown in FIG. 5.

A fourth conductive layer including a plurality of ohmic contacts (contact members) 190a, 190b, 190c and 190d may be disposed on the third insulating layer 181.

The ohmic contacts (contact members) 190a, 190b and 190c is disposed in the pixels PX1, PX2 and PX3, respectively, and may be in contact with the capacitor electrode 175 through the contact hole 83a to be electrically connected to the capacitor electrode 175.

The ohmic contact (contact member) 190d may be in contact with the common voltage line 170 though the contact hole 81 to be electrically connected to the common voltage line 170.

The ohmic contacts (contact members) 190a, 190b, 190c and 190d may improve the adherence of the capacitor electrode 175 and the common voltage line 170 of the third conductive layer which are respectively in contact therewith and other conductive layers, and may effectively prevent oxidation of the third conductive layer. In an exemplary embodiment, where the upper layer of the third conductive layer contains copper, the oxidation of copper may be prevented. In an exemplary embodiment, the fourth conductive layer may include a conductive material that may prevent the corrosion of the upper layer of the third conductive layer. Accordingly, in such an embodiment where the upper layer of the third conductive layer includes copper, the conductive material prevents the copper corrosion by capping the upper layer of the third conductive layer. In one exemplary embodiment, for example, the fourth conductive layer may include a conductive material such as a metal oxide such as indium tin oxide ("ITO") or indium zinc oxide ("IZO").

A fourth insulating layer 182 may be disposed on the third insulating layer 181 and the fourth conductive layer. Referring to FIG. 4, the fourth insulating layer 182 is disposed on each of the ohmic contacts (contact members) 190a, 190b and 190c, and a contact hole 83b may be defined through the fourth insulating layer 182 to overlap the contact hole 83a.

At least one selected from the buffer layer 120, the second insulating layer 160, the third insulating layer 181 and the fourth insulating layer 182 includes an inorganic insulating material such as a silicon nitride (SiNx), a silicon oxide (SiOx), and silicon oxynitride (SiON), and/or an organic insulating material. In an exemplary embodiment, the fourth insulating layer 182 may include the inorganic insulating material and/or the organic insulating material such as a polyimide, an acryl-based polymer, a siloxane-based polymer, or the like, and may have a substantially flat upper surface.

A fifth conductive layer (or a pixel electrode layer) including a plurality of pixel electrodes 191a, 191b and 191c may be disposed on the fourth insulating layer 182. Each pixel electrode 191a, 191b or 191c may be disposed in a corresponding one of the pixels PX1, PX2 and PX3 as shown in FIG. 2. The planar sizes and shapes of the pixel electrodes 191a, 191b and 191c disposed in the three pixels PX1, PX2 and PX3 may differ from each other, but the invention is not limited thereto. In an exemplary embodiment, the pixel PX2 represents green, the pixel PX1 represents red, and the pixel PX3 represents blue, but not being limited thereto.

Each pixel electrode 191a, 191b or 191c may be in contact with a corresponding ohmic contact (contact member) 190a, 190b or 190c through the contact hole 83b of the fourth insulating layer 182, and may be electrically connected to the capacitor electrode 175 through the corresponding ohmic contact (contact members) 190a, 190b or 190c. Thus, each pixel electrode 191a, 191b or 191c may be electrically connected to the drain region 135a of the first transistor T1 to receive the voltage from the first transistor T1.

The pixel electrode layer may include a semi-transmissive or reflective conductive material.

A fifth insulating layer 350 may be disposed on the fourth insulating layer 182. An opening 355 is defined through the fifth insulating layer 350 to overlap the pixel electrodes 191a, 191b and 191c. The fifth insulating layer 350 may include an organic insulating material such as a polyacryl-based resin, a polyimide resin, or the like.

An emission layer 370 is disposed on the fifth insulating layer 350 and the pixel electrode layer. The emission layer 370 may include a portion disposed within the opening 355 of the fifth insulating layer 350. The emission layer 370 may comprise an organic luminescent material or an inorganic luminescent material. Alternatively, at least a portion of the fifth insulating layer 350 may not be covered by the emission layer 370.

A contact hole 82 may be defined through the fifth insulating layer 350 and the emission layer 370 to overlap the ohmic contact 190d.

A common electrode 270 is disposed above the emission layer 370. The common electrode 270 may be disposed continuously over a plurality of pixels PX1, PX2 and PX3. The common electrode 270 may be electrically connected to the common voltage line 170 by contacting the ohmic contact 190d through the contact hole 82 to receive the common voltage.

The common electrode 270 may include a conductive transparent material.

The pixel electrodes 191a, 191b and 191c, the emission layer 370, and the common electrode 270 of each pixel PX1, PX2 or PX3 collectively define the light emitting diode ED, and one of each pixel electrode 191a, 191b or 191c, and the common electrode 270 may be a cathode and the other of each pixel electrode 191a, 191b or 191c, and the common electrode 270 may be an anode. In an exemplary embodiment, for example, the pixel electrodes 191a, 191b and 191c are the anode.

Referring to FIG. 2, the lower pattern 111 overlaps the entire active pattern 130a of the first transistor T1 in a plan view, thereby overlapping all of the source region 133a, the channel region 134a and the drain region 135a of the first transistor T1. In such an embodiment, the edge of the lower pattern 111 is disposed outside the edge of the active pattern 130a and may have a shape enclosing the active pattern 130a. In such an embodiment, the lower pattern 111 may overlap all edges of the active pattern 130a, and the active pattern 130a may not cross the edges of the lower pattern 111. In such an embodiment, the active pattern 130a may be disposed inside the lower pattern 111 in a plan view.

Accordingly, in a plan view, since the active pattern 130a does not cross the edge of the lower pattern 111, defects such as the disconnection of the active pattern 130a near an edge of the lower pattern 111 due to a relatively large step at the edge of the lower pattern 111 having a greater thickness than the active pattern 130a may be effectively prevented, and layout arrangement efficiency near the lower pattern 111 and the active pattern 130a may be increased.

The lower pattern 111 is electrically connected to the pixel electrodes 191a, 191b and 191c through the capacitor electrode 175 and also overlaps the channel region 134a of the first transistor T1. Accordingly, a current variation rate is reduced in a saturation region of a voltage-current characteristic graph of the first transistor T1 such that a range of a region where the output current of the first transistor T1 is constant may be increased. Therefore, even when the source-drain voltage of the first transistor T1 is changed, the output current of the first transistor T1 is maintained to be constant, thereby improving the output saturation characteristic. Thus, the luminance deviation between the pixels due to the output current of the first transistor T1 is reduced, thereby improving the image quality.

Next, an alternative exemplary embodiment of the display device according to the invention will be described with reference to FIG. 6 along with the above-described drawings.

Figure 6:
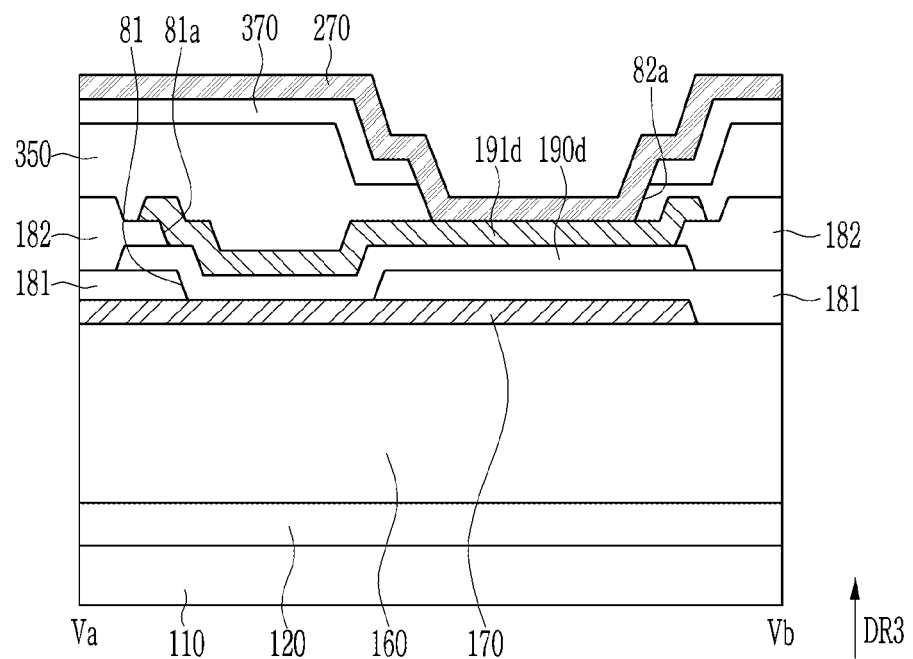
FIG. 6 is a cross-sectional view of an alternative exemplary embodiment of a display device corresponding to the cross-sectional view taken along line Va-Vb shown in FIG. 2.

FIG. 6 is a cross-sectional view of an alternative exemplary embodiment of a display device corresponding to the cross-sectional view taken along line Va-Vb of a display device shown in FIG. 2, An exemplary embodiment shown in FIG. 6 is substantially the same as the above-described exemplary embodiment with reference to FIGS. 2 to 5, except that another contact hole 81a is defined through the fourth insulating layer 182 to overlap the ohmic contact (the contact member) 190d, and the pixel electrode layer may further include an ohmic contact (the contact member) 191d in contact with the ohmic contact (the contact member) 190d through the contact hole 81a. In such an embodiment, the fifth insulating layer 350 and the emission layer 370 may overlap a contact hole 82a disposed on the ohmic contacts (the contact member) 191d. The common electrode 270 may be electrically connected to the common voltage line 170 by contacting the ohmic contact 191d through the contact hole 82a to receive the common voltage.

Hereinafter, other alternative exemplary embodiment of the display device according to the invention will be described with reference to FIG. 7 and FIG. 8 along with the above-described drawings.

Figure 7:
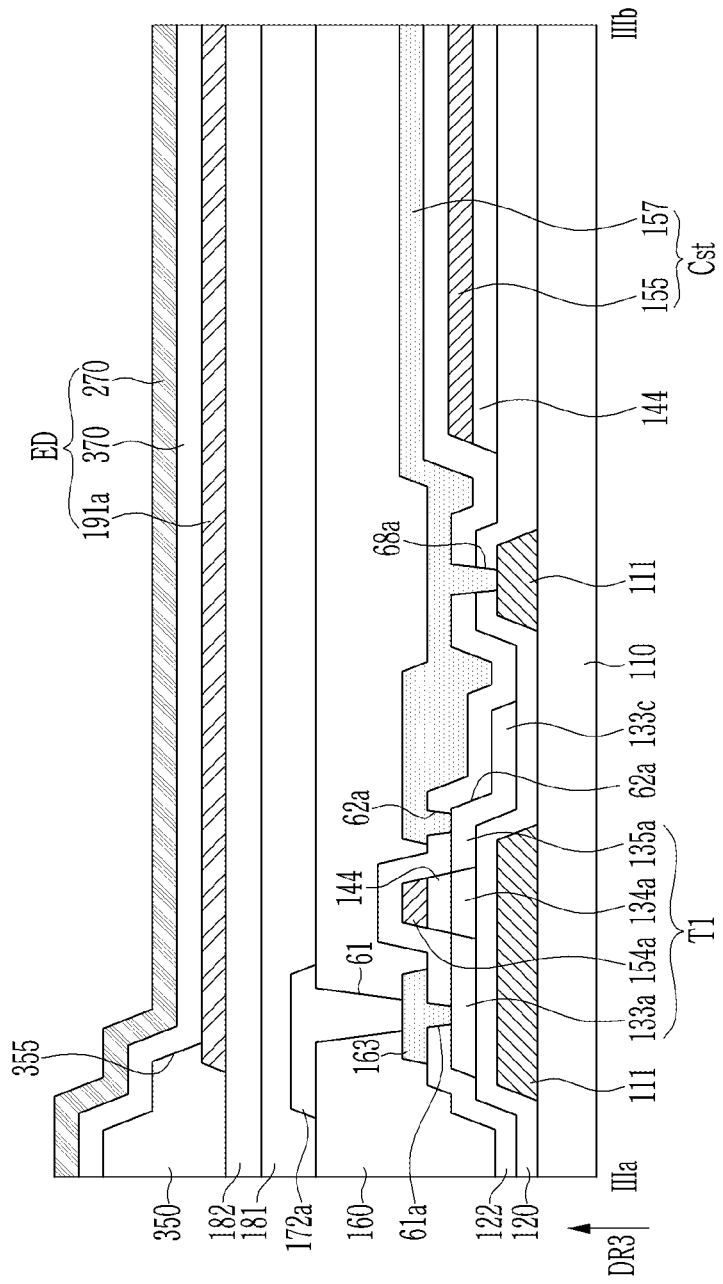
FIG. 7 and FIG. 8 are cross-sectional views of other alternative exemplary embodiments of a display device corresponding to the cross-sectional view taken along line IIIa-IIIb shown in FIG. 2.
Figure 8:
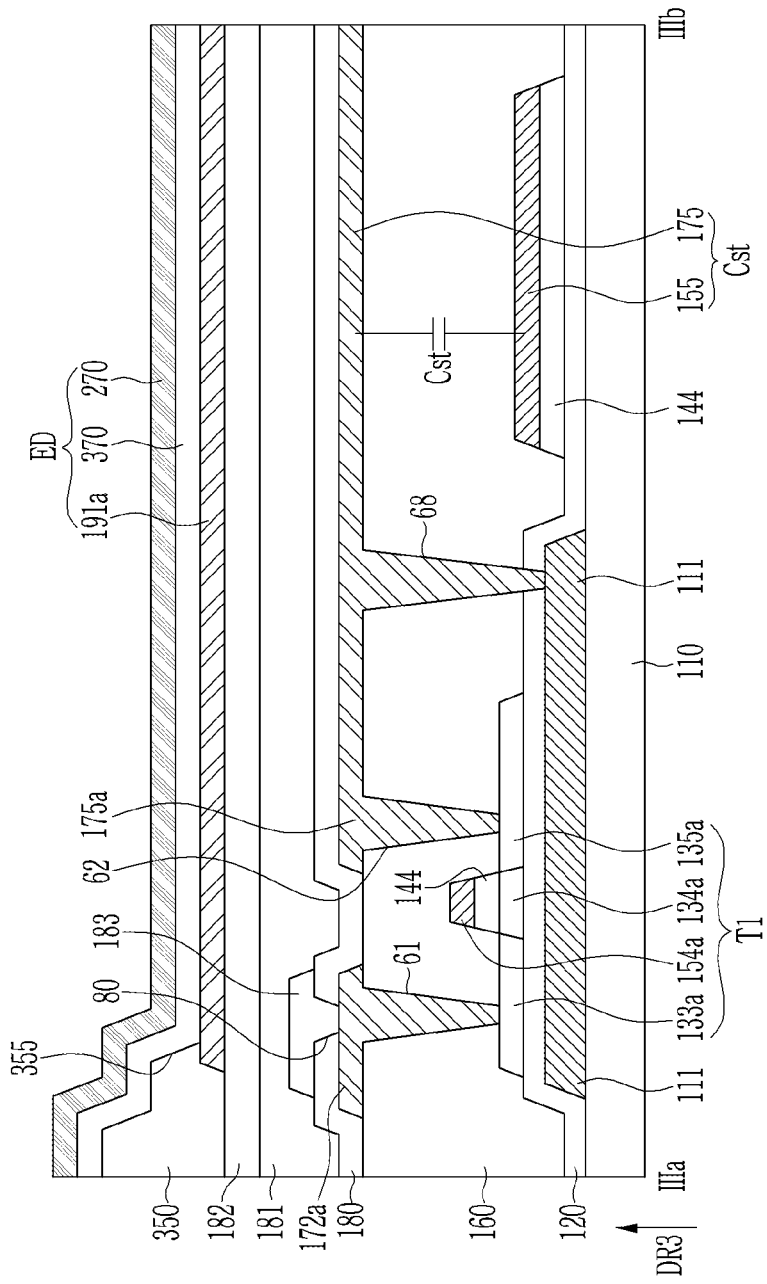

FIG. 7 and FIG. 8 show cross-sectional views of other alternative exemplary embodiments of a display device corresponding to the cross-sectional view taken along line IIIa-IIIb shown in FIG. 2, respectively.

An exemplary embodiment shown in FIG. 7 is substantially the same as the above-described exemplary embodiment with reference to FIGS. 2 to 5, except that a sixth insulating layer 122 disposed on the second conductive layer and a sixth conductive layer disposed between the sixth insulating layer 122 and the second insulating layer 160 may be further included.

In such an embodiment, the sixth insulating layer 122 may be in contact with the upper surface of the conductive region of the active patterns 130a, 130b and 130c. As shown in FIG. 7, a contact hole 61a is defined through the sixth insulating layer 122 to overlap the contact hole 61 of the second insulating layer 160, and contact holes 62a and 68a are further defined through the sixth insulating layer 122.

Such an embodiment of a display device may include a capacitor electrode 157 disposed on the sixth conductive layer instead of the above-described capacitor electrode 175. The capacitor electrode 157 may be electrically connected to the lower pattern 111 through the contact hole 68a, and may be electrically connected to the drain region 135a of the active pattern 130a through the contact hole 62a.

The capacitor electrode 157 may have a planar shape, similar to the capacitor electrode 175 described above. The capacitor electrode 157 may overlap the corresponding driving gate electrode 155 with the sixth insulating layer 122 therebetween to form the capacitor Cst.

The sixth conductive layer may include a connection pattern 163. In one exemplary embodiment, for example, the sixth conductive layer includes a connection pattern 163 in contact with the source region 133a of the active pattern 130a through the contact hole 61a, and the driving voltage line 172a is in contact with the connection pattern 163 through the contact hole 61 of the second insulating layer 160 to be electrically connected thereto, such that the driving voltage line 172a may be electrically connected to the source region 133a of the active pattern 130a.

An exemplary embodiment of the display device shown in FIG. 8 is substantially the same as the above-described exemplary embodiment with reference to FIGS. 2 to 5, except that a seventh insulating layer 180 disposed between the third conductive layer and the third insulating layer 181 and a seventh conductive layer disposed between the seventh insulating layer 180 and the third insulating layer 181 may be further included.

In a plan view, the seventh conductive layer may include conductive patterns extending substantially parallel to the pattern of the data lines 171a, 171b and 171c, the driving voltage lines 172a, 172c and 172d, the common voltage line 170, and the initialization voltage line 173 disposed in the underlying third conductive layer and electrically connected thereto. In one exemplary embodiment, for example, referring to FIG. 8, the seventh conductive layer may include a conductive pattern 183 electrically connected to the driving voltage line 172a through a contact hole 80 of the seventh insulating layer 180.

In a plan view, the conductive pattern 183 may have a planar shape substantially similar to that of the third conductive layer to which the conductive pattern 183 is connected. The conductive pattern 183 may reduce the resistance by transmitting a same voltage as the conductive layer connected thereto.

Alternatively, a part of the data lines 171a, 171b and 171c, the driving voltage lines 172a, 172c and 172d, the common voltage line 170, the initialization voltage line 173, the capacitor electrode 175, and the connecting members 174, 176, 177 and 178 disposed in the third conductive layer may be disposed in the third conductive layer and the remaining part thereof may be disposed in the seventh conductive layer.

Next, another alternative exemplary embodiment of the display device according to the invention will be described with reference to FIG. 9 along with the above-described drawings.

Figure 9:
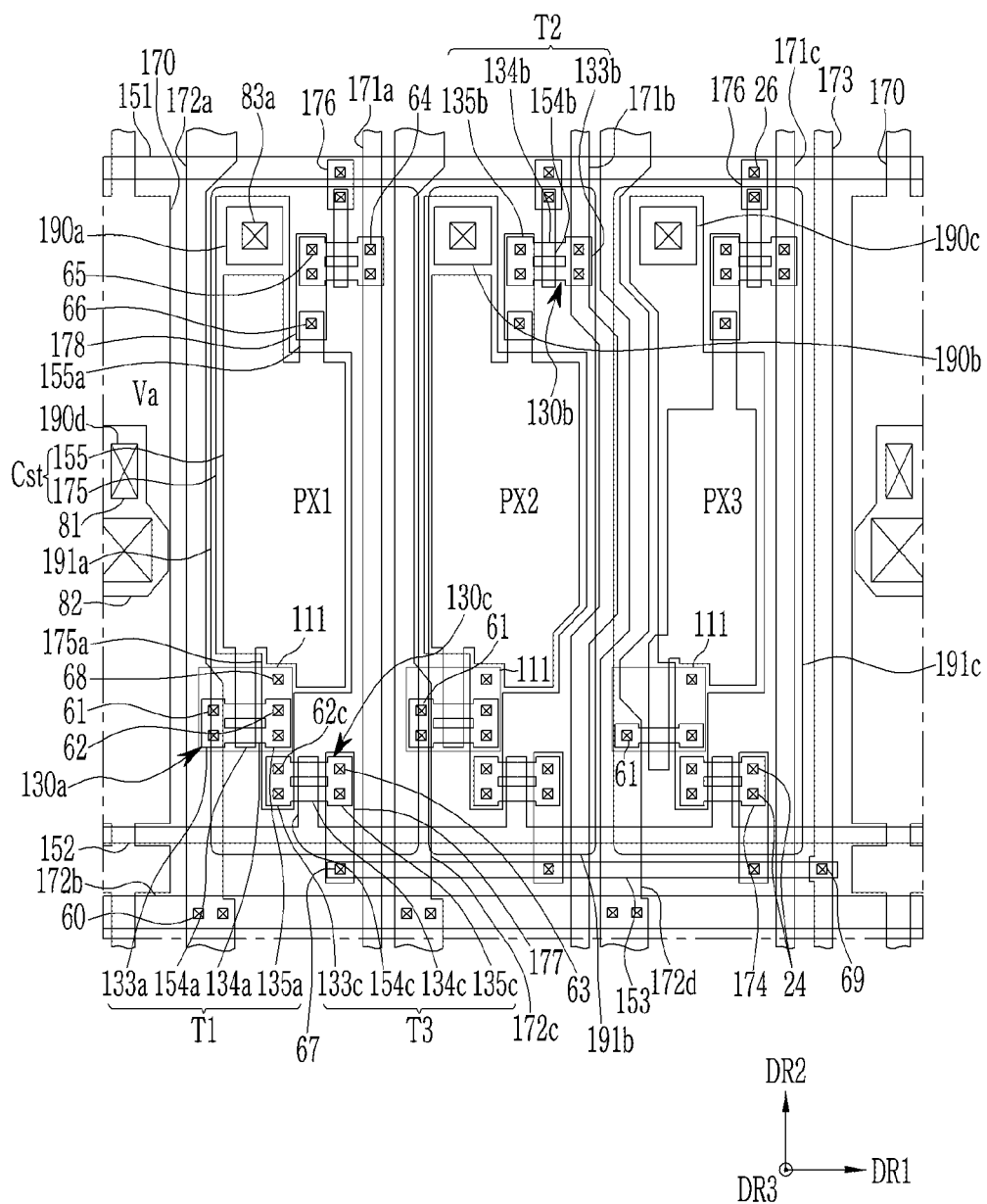
FIG. 9 is a plan view of a plurality of pixels of a display device according to an alternative exemplary embodiment of the invention.

FIG. 9 is a plan view of a plurality of pixels of a display device according to an alternative exemplary embodiment of the invention.

An exemplary embodiment of the display device shown in FIG. 9 may be substantially the same as the exemplary embodiment described with reference to FIG. 2 to FIG. 5 described above, except that the active pattern 130a and the active pattern 130c may be separated or spaced from each other in each pixel PX1, PX2 or PX3.

In such an embodiment, the lower pattern 111 overlaps the entire active pattern 130a in a plan view, thereby overlapping all of the source region 133a, the channel region 134a, and the drain region 135a of the first transistor T1. The edge of the lower pattern 111 may be disposed outside the edge of the active pattern 130a, and may have the shape enclosing one active pattern 130a. In such an embodiment, the lower pattern 111 may overlap all edges of the active pattern 130a, and the active pattern 130a may not cross the edges of the lower pattern 111. In such an embodiment, none of the active patterns 130a, 130b and 130c may cross the edges of the lower pattern 111. In such an embodiment, the edge of the lower pattern 111 may not overlap the active patterns 130a, 130b and 130c of the active layer in a plan view, and may not cross the edges of any active patterns 130a, 130b and 130c.

Accordingly, in a plan view, since no active pattern 130a, 130b and 130c crosses an edge of the lower pattern 111, the defects such as the disconnection of the active pattern 130a, 130b or 130c near the edge of the lower pattern 111 due to a relatively large step at the edge of the lower pattern 111 having a greater thickness than the active patterns 130a, 130b and 130c may be effectively prevented.

The active patterns 130b and 130c may not overlap the lower pattern 111.

The edge of the lower pattern 111 may traverse a space between the active pattern 130a and the active pattern 130b that are spaced apart from each other. In such an embodiment, the edges of the lower pattern 111 may be disposed between the active pattern 130a and the active pattern 130b that are spaced apart from each other.

The drain region 135a of the active pattern 130a and the source region 133c of the active pattern 130c, which are separated or spaced from each other, may be electrically connected to each other through a conductive layer other than the first conductive layer and the second conductive layer. In such an embodiment, the drain region 135a of the active pattern 130a and the source region 133c of the active pattern 130c, which are spaced apart from each other, are electrically connected to each other through the contact holes 62 and 62c and the protrusion 175a of the capacitor electrode 175 disposed in the third conductive layer.

In such an embodiment, the third gate electrode 154c may be protruded above the second scan line 152 to extend in the second direction DR2. In such an embodiment, the third gate electrode 154c may be directly connected to the second scan line 152.

Next, an exemplary embodiment of the display device according to the invention will be described with reference to FIG. 10 and FIG. 11 along with the above-described drawings.

Figure 10:
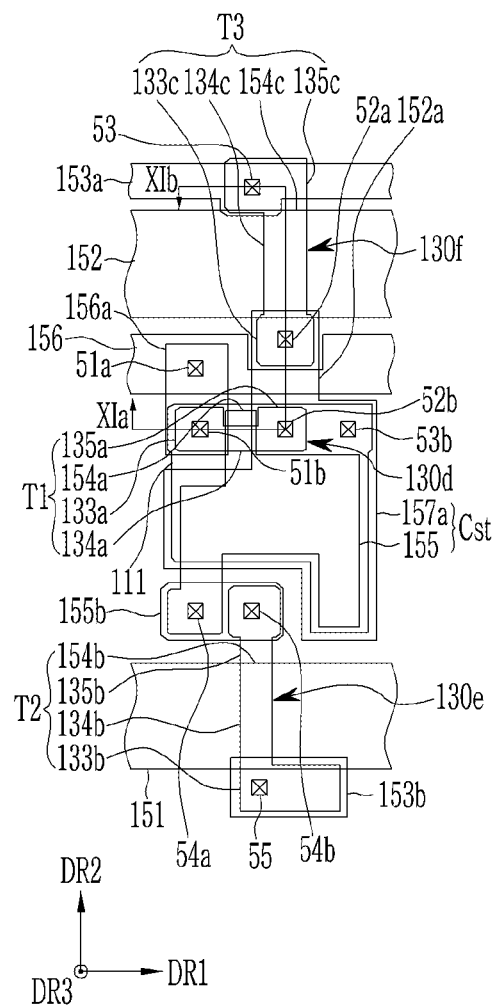
FIG. 10 is a plan view of a part of one pixel of a display device according to an exemplary embodiment of the invention.
Figure 11:
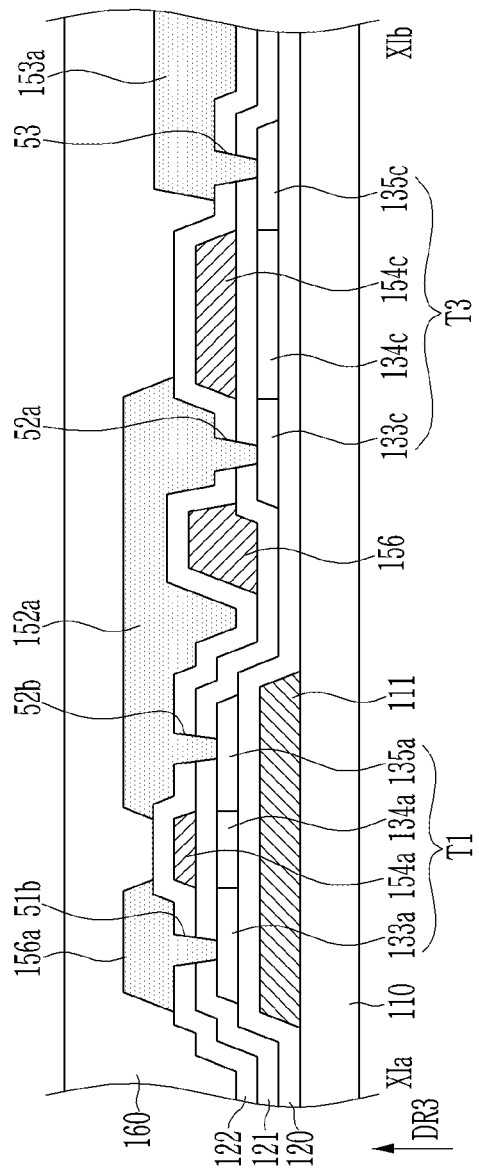
FIG. 11 is a cross-sectional view taken along line XIa-XIb shown in FIG. 10.

FIG. 10 is a plan view of a part of one pixel of a display device according to an exemplary embodiment of the invention, and FIG. 11 is a cross-sectional view taken along line XIa-XIb shown in FIG. 10.

In FIGS. 10 and 11, the same or like elements have been labeled with the same reference characters as used above to describe the exemplary embodiments of the display device shown in FIGS. 2 to 5. In such an embodiment, the functions of the corresponding constituent elements may be the same as each other, but the planar or cross-sectional structure may be different from each other.

Such an embodiment of the display device shown in FIG. 10 and FIG. 11 may include the first conductive layer, the buffer layer 120, the active layer, the first insulating layer 121, the second conductive layer, the sixth insulating layer 122, the sixth conductive layer, and the second insulating layer 160, which are sequentially stacked one on another on the substrate 110.

The first conductive layer may include the lower pattern 111.

The active layer may include a plurality of active patterns 130d, 130e and 130f disposed at one pixel. The plurality of active patterns 130d, 130e and 130f may include the channel regions 134a, 134b and 134c forming each channel of the transistors T1, T2 and T3, and the source regions 133a, 133b and 133c, and the drain regions 135a, 135b and 135c. The active patterns 130d, 130e and 130f may be spaced apart from each other.

The second conductive layer may include the first and second scan lines 151 and 152, a transverse driving voltage line 156 for transmitting the driving voltage, and the driving gate electrode 155. The first scan line 151 may include the second gate electrode 154b crossing the active pattern 130e and overlapping the channel region 134b of the active pattern 130e, the second scan line 152 may include the third gate electrode 154c crossing the active pattern 130f and overlapping the channel region 134c of the active pattern 130f, and the driving gate electrode 155 may include the first gate electrode 154a crossing the active pattern 130d and overlapping the channel region 134a of the active pattern 130d. The driving gate electrode 155 may be disposed between the first scan line 151 and the second scan line 152 in a plan view.

The source region 133a, the channel region 134a and the drain region 135a of the active pattern 130d and the first gate electrode 154a may collectively define the first transistor T1, the source region 133b, the channel region 134b and the drain region 135b of the active pattern 130e and the second gate electrode 154b may collectively define the second transistor T2, and the source region 133c, the channel region 134c and the drain region 135c of the active pattern 130f and the third gate electrode 154c may collectively define the third transistor T3.

The sixth conductive layer may include a transverse initialization voltage line 153a, a plurality of connecting members 153b, 155b and 156a, and a capacitor electrode 157a. The capacitor electrode 157a may include a protrusion 152a protruded toward the active pattern 130f.

The transverse initialization voltage line 153a may be electrically connected to the drain region 135c of the active pattern 130f through a contact hole 53.

The connecting member 153b may be electrically connected to the source region 133b of the active pattern 130e through a contact hole 55 to transmit the data voltage.

The connecting member 155b may be electrically connected to the driving gate electrode 155 through a contact hole 54a and electrically connected to the drain region 135b of the active pattern 130e through a contact hole 54b. Thus, the driving gate electrode 155 may be electrically connected to the drain region 135b of the active pattern 130e.

The connecting member 156a may be electrically connected to the transverse driving voltage line 156 through a contact hole 51a and electrically connected to the source region 133a of the active pattern 130d through a contact hole 51b. Thus, the source region 133a of the active pattern 130d may be electrically connected to the transverse driving voltage line 156 to deliver the driving voltage.

The capacitor electrode 157a may be electrically connected to the source region 133c of the active pattern 130f through a contact hole 52a and electrically connected to the drain region 135a of the active pattern 130d through a contact hole 52b. Thus, the source region 133c of the active pattern 130f and the drain region 135a of the active pattern 130d may be electrically connected to each other. The capacitor electrode 157a may be electrically connected to the lower pattern 111 through a contact hole 53b.

The capacitor electrode 157a overlaps the driving gate electrode 155 to form the capacitor Cst.

In such an embodiment, the edge of the lower pattern 111 is disposed outside the edge of the active pattern 130d, and may have the shape surrounding the active pattern 130d. In such an embodiment, the lower pattern 111 may overlap all of the edges of the active pattern 130d, and the active pattern 130d may not cross the edges of the lower pattern 111. In such an embodiment, no active patterns 130d, 130e and 130f may cross the edges of the lower pattern 111. In such an embodiment, the edges of the lower pattern 111 may not overlap the active patterns 130d, 130e and 130f of the active layer in a plan view, and may not overlap the edges of any active patterns 130d, 130e and 130f.

In such an embodiment, since no active patterns 130d, 130e and 130f cross with the edges of the lower pattern 111, the defects such as the disconnection of the active patterns 130d, 130e and 130f in near the edge of the lower pattern 111 due to a relatively large step at the edge of the lower pattern 111 having a greater thickness than the active patterns 130d, 130e and 130f may be effectively prevented.

The drain region 135a of the active pattern 130d and the source region 133c of the active pattern 130f, which are spaced apart from each other, may be electrically connected to each other through a conductive layer other than the first conductive layer and the second conductive layer. In such an embodiment, the drain region 135a of the active pattern 130d and the source region 133c of the active pattern 130f, which are spaced apart from each other, may be electrically connected to each other through the capacitor electrode 157a disposed in the sixth conductive layer and through the contact holes 52a and 52b.

Next, an alternative exemplary embodiment of the display device according to the invention will be described with reference to FIG. 12 to FIG. 14 along with the above-described drawings.

Figure 12:
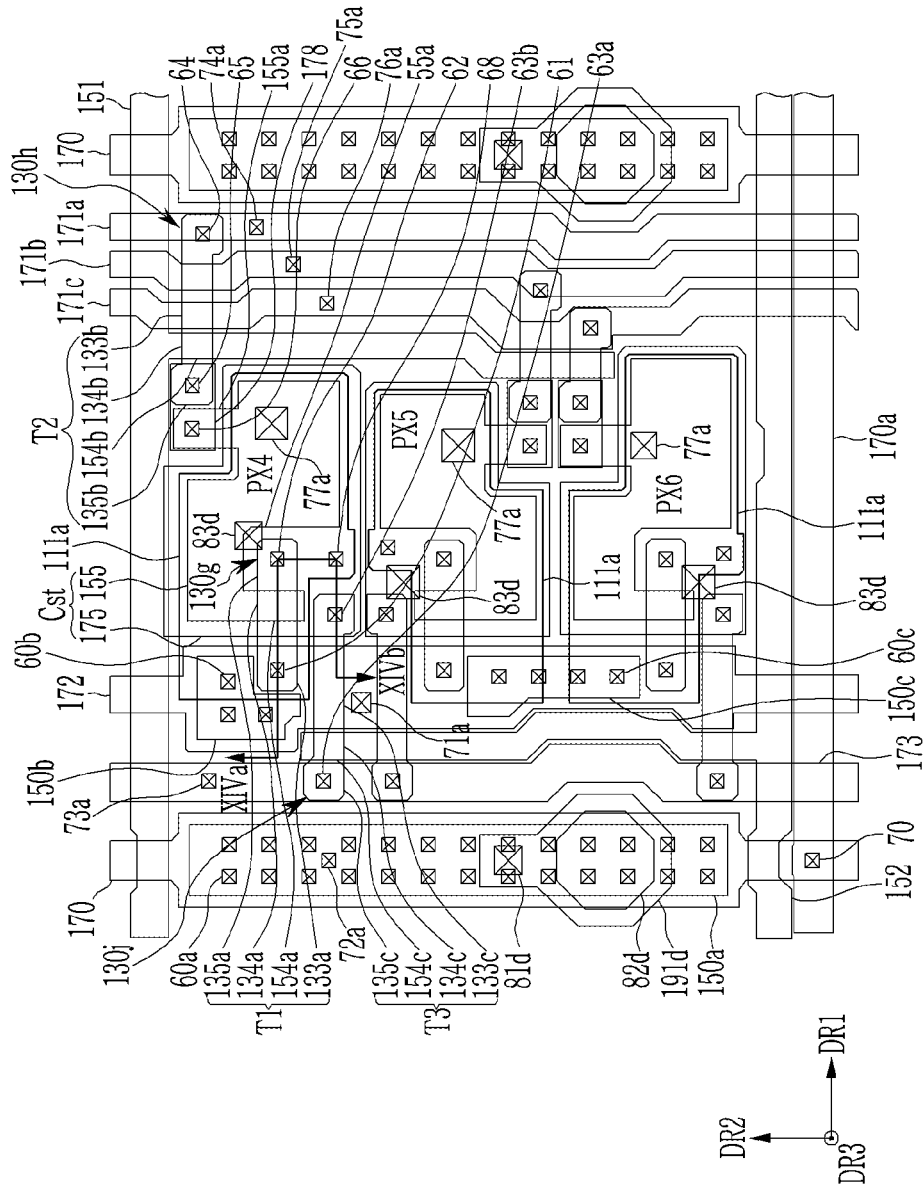
FIG. 12 is a plan view of a plurality of pixels of a display device according to an alternative exemplary embodiment of the invention.
Figure 13:
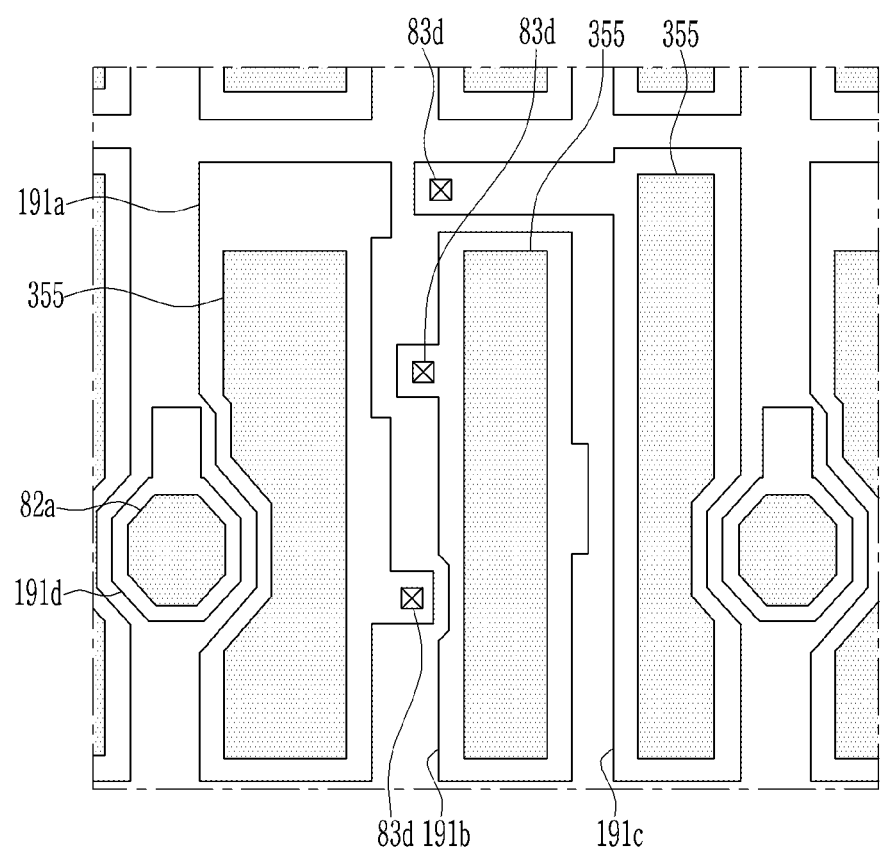
FIG. 13 is a plan view of a pixel electrode layer of a display device according to an exemplary embodiment of the invention.
Figure 14:
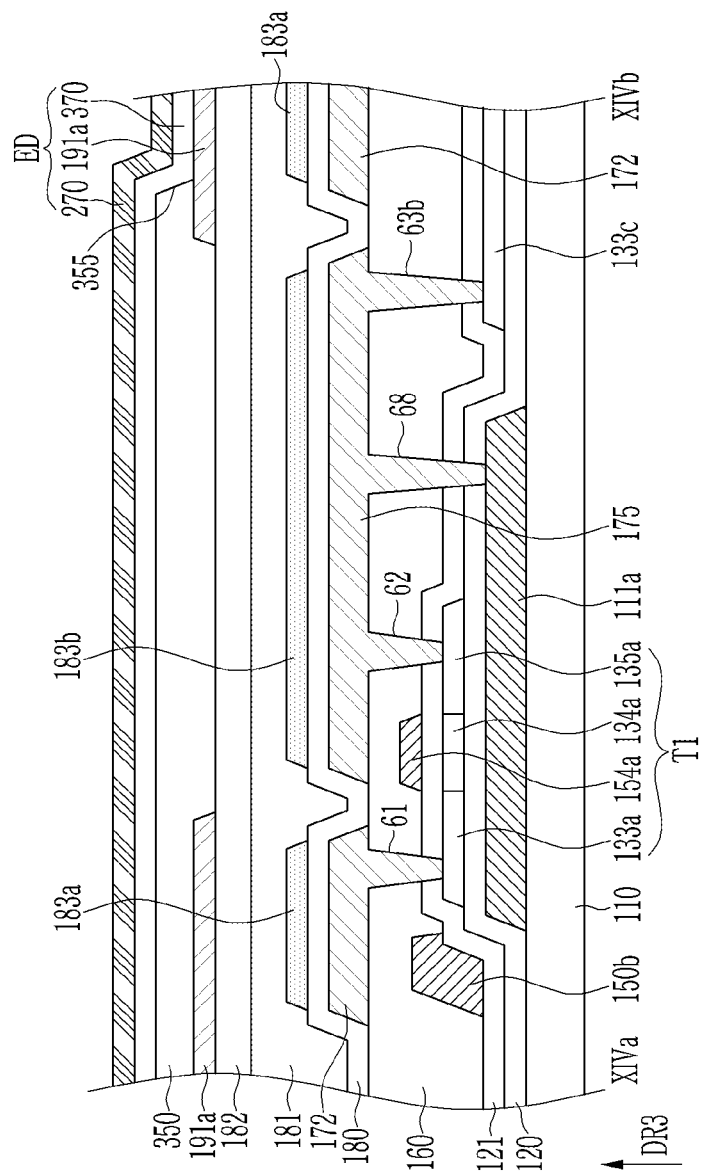
FIG. 14 is a cross-sectional view taken along line XIVa-XIVb shown in FIG. 12.

FIG. 12 is a plan view of a plurality of pixels of a display device according to an alternative exemplary embodiment of the invention, FIG. 13 is a plan view of a pixel electrode layer of a display device according to an exemplary embodiment of the invention, and FIG. 14 is a cross-sectional view taken along line XIVa-XIVb shown in FIG. 12.

The exemplary embodiment of the display device shown in FIGS. 12 to 14 has substantially the same connection relationship and stacked structure of the constituent elements as the exemplary embodiments of the display device described above, except for the detailed shape and connection method of each of the constituent elements. The same or like elements shown in FIGS. 12 to 14 have been labeled with the same reference characters as used above to describe the exemplary embodiments of the display device shown in FIGS. 2 to 5, and any repetitive detailed description thereof will hereinafter be omitted or simplified.

Referring to FIG. 12, in an exemplary embodiment, a plurality of repeated pixels PX4, PX5 and PX6 of one group (or a pixel unit) may be arranged in the second direction DR2, while the pixel electrodes 191a, 191b and 191c respectively corresponding to the pixels PX4, PX5 and PX6 may be arranged in the first direction DR1 as shown in FIG. 13. However, the structure of the pixel PX4, PX5 and PX6 and the corresponding pixel electrodes 191a, 191b and 191c is not limited thereto.

Referring to FIG. 12, the plurality of data lines 171a, 171b and 171c, a driving voltage line 172, and the initialization voltage line 173 may be disposed between two adjacent common voltage lines 170.

The first scan line 151 and the second scan line 152 may be respectively disposed above and below the plurality of pixels PX4, PX5 and PX6 of one group in a plan view.

The first conductive layer described above may include a plurality of lower patterns 111a, and a lower pattern 111a may be disposed in each of the pixels PX4, PX5 and PX6. The first conductive layer may further include a transverse common voltage line 170a extending in the first direction DR1.

A plurality of active patterns 130g, 130h and 130j disposed in the active layer may include the channel regions 134a, 134b and 134c forming channels of the transistors T1, T2 and T3, respectively, the source regions 133a, 133b and 133c, and the drain regions 135a, 135b and 135c. In such an embodiment, the active patterns 130g, 130h and 130j in each pixel PX4, PX5 and PX6 may be spaced apart from one another.

The second conductive layer may include the first scan line 151, the second scan line 152, the driving gate electrode 155, the second gate electrode 154b, and the third gate electrode 154c. Each of the first and second scan lines 151 and 152 may extend in the first direction DR1.

Each driving gate electrode 155 may be disposed corresponding to each pixel PX4, PX5 or PX6.

The plurality of second gate electrodes 154b corresponding to the plurality of pixels PX4, PX5 and PX6 may be connected to each other and extend substantially toward the second scan line 152 with a shape extending in the second direction DR2.

The plurality of third gate electrodes 154c corresponding to the plurality of pixels PX4, PX5 and PX6 may be connected to each other and extend substantially toward the first scan line 151 with a shape extending in the second direction DR2.

The driving gate electrode 155 disposed at each pixel PX4, PX5 or PX6 may include the first gate electrode 154a having a shape protruding upward or downward. The first gate electrode 154a crosses the active pattern 130g and overlaps the channel region 134a of the active pattern 130g. The second gate electrode 154b crosses the active pattern 130h and overlaps the channel region 134b of the active pattern 130h. The third gate electrode 154c crosses the active pattern 130j and overlaps the channel region 134c of the active pattern 130j.

The third conductive layer may include the plurality of data lines 171a, 171b and 171c, the driving voltage line 172, the common voltage line 170, the initialization voltage line 173, the capacitor electrode 175, and the plurality of connecting members 178.

Each of the data lines 171a, 171b and 171c, the driving voltage line 172, the common voltage line 170 and the initialization voltage line 173 may substantially extend in the second direction DR2, thereby crossing the first and second scan lines 151 and 152.

Each data line 171a, 171b or 171c is electrically connected to the source region 133b of the active pattern 130h via the contact hole 64. The driving voltage line 172 is electrically connected to the source region 133a of the active pattern 130g through the contact hole 61. The initialization voltage line 173 is electrically connected to the drain region 135c of the active pattern 130j via a contact hole 63a. The contact holes 61, 63a and 64 may be defined or formed in the second insulating layer 160.

The capacitor electrode 175 may be disposed in each pixel PX4, PX5 or PX6, and may be disposed between the driving voltage line 172 and the data line 171c in a plan view. The capacitor electrode 175 may overlap the corresponding driving gate electrode 155 with the second insulating layer 160 therebetween to form the capacitor Cst.

The capacitor electrode 175 is electrically connected to the drain region 135a of the active pattern 130g through the contact hole 62 of the second insulating layer 160, and is electrically connected to the source region 133c of the active pattern 130j through a contact hole 63b of the second insulating layer 160 and first insulating layer 121. In such an embodiment, the capacitor electrode 175 is electrically connected to the lower pattern 111a through the contact hole 68 of the second insulating layer 160, the first insulating layer 121, and the buffer layer 120. An opening 55a is defined through the driving gate electrode 155 to overlap the contact hole 62 for the contact between the capacitor electrode 175 and the drain region 135a of the active pattern 130g in a way such that the driving gate electrode 155 surrounds the contact hole 62.

In each pixel PX4, PX5 or PX6, the connecting member 178 is electrically connected to the drain region 135b of the active pattern 130h through the contact hole 65 and electrically connected to the protrusion 155a of the driving gate electrode 155 through the contact hole 66, such that the drain region 135b of the active pattern 130h and the protrusion 155a of the driving gate electrode 155 may be electrically connected to each other.

In such an embodiment, the display device may include the seventh insulating layer 180 and the seventh conductive layer disposed between the third conductive layer and the third insulating layer 181 as in the exemplary embodiment shown in FIG. 8.

Referring to FIG. 12 and FIG. 14, the seventh conductive layer may include the conductive pattern electrically connected to the conductive pattern of the third conductive layer while having a similar planar shape to that of the conductive pattern of the third conductive layer such as the data lines 171a, 171b and 171c, the driving voltage line 172, the common voltage line 170, the initialization voltage line 173, and the capacitor electrode 175 disposed in the underlying third conductive layer.

In one exemplary embodiment, for example, the data lines 171a, 171b and 171c are electrically connected to the corresponding conductive pattern disposed in the seventh conductive layer through contact holes 74a, 75a and 76a, respectively, the driving voltage line 172 is electrically connected to the corresponding conductive pattern 183a disposed in the seventh conductive layer through a contact hole 71a, the common voltage line 170 is electrically connected to the corresponding conductive pattern disposed in the seventh conductive layer through a contact hole 72a, the initialization voltage line 173 is electrically connected to the corresponding conductive pattern disposed in the seventh conductive layer through a contact hole 73a, and the capacitor electrode 175 is electrically connected to a corresponding conductive pattern 183b disposed in the seventh conductive layer through a contact hole 77a.

The conductive patterns of the seventh conductive layer transmit a same voltage as the connected third conductive layer, thereby reducing the resistance.

A contact hole 83d is defined through the third insulating layer 181 to overlap the conductive pattern 183b of the seventh conductive layer connected to the capacitor electrode 175, and a contact hole 81d is defined through the third insulating layer 181 to overlap on the conductive pattern of the seventh conductive layer connected to the common voltage line 170.

In such an embodiment, the display device may further include the fourth conductive layer described above.

The plurality of pixel electrodes 191a, 191b and 191c disposed in the pixel electrode layer of the fifth conductive layer and corresponding to each pixel PX4, PX5 and PX6 may be electrically connected to the conductive pattern 183b of the seventh conductive layer connected to the capacitor electrode 175 through the contact hole 83d defined in the fourth insulating layer 182. Each pixel electrode 191a, 191b or 191c is electrically connected to the drain region 135a of the first transistor T1 via the capacitor electrode 175, thereby receiving the voltage from the first transistor T1.

The pixel electrode layer may further include the ohmic contact (the contact member) 191d connected to the common voltage line 170 like the above-described exemplary embodiment. The common electrode 270 is electrically connected to the ohmic contact (the contact member) 191d through a contact hole 82d defined in the fifth insulating layer 350 and the emission layer 370, thereby receiving the common voltage from the common voltage line 170.

The common voltage line 170 may be electrically connected to the transverse common voltage line 170a through a contact hole 70.

The second conductive layer may further include a conductive pattern 150a overlapping the common voltage line 170 and conductive patterns 150b and 150c overlapping the driving voltage line 172. In such an embodiment, the conductive pattern 150a is electrically connected to the common voltage line 170 through a plurality of contact holes 60a of the second insulating layer 160, thereby reducing the resistance. The conductive patterns 150b and 150c are electrically connected to the driving voltage line 172 through a plurality of contact holes 60b and 60c of the second insulating layer 160. Alternatively, the conductive patterns 150a, 150b and 150c may be omitted.

In an exemplary embodiment, the edge of the lower pattern 111a may be disposed outside the edge of the active pattern 130g and may have a shape enclosing the active pattern 130g. In such an embodiment, no active patterns 130g, 130h or 130j may cross the edge of the lower pattern 111a. Accordingly, the edges of the lower pattern 111a may not cross the edges of any active patterns 130g, 130h and 130j without overlapping the active patterns 130g, 130h and 130j of the active layer in a plan view.

Accordingly, in a plan view, since no active pattern 130g, 130h or 130j crosses the edge of the lower pattern 111a, the defects such as the disconnection of the active patterns 130g, 130h and 130j near the edge of the lower pattern 111a due to a relatively large step at the edge of the lower pattern 111 having a greater thickness than the active patterns 130g, 130h and 130j may be effectively prevented.

The drain region 135a of the active pattern 130g and the source region 133c of the active pattern 130j, which are separated from each other, may be electrically connected to each other through a conductive layer other than the first conductive layer and the second conductive layer. In one exemplary embodiment, for example, the drain region 135a of the active pattern 130g and the source region 133c of the active pattern 130j, which are spaced apart from each other, may be electrically connected to each other through the contact holes 62 and 63b and the capacitor electrode 175 disposed in the third conductive layer.

While the invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate;
a first conductive layer including a lower pattern disposed on the substrate;
a first transistor disposed on the substrate and including a first active pattern and a first gate electrode;
a second transistor disposed on the substrate and including a second active pattern and a second gate electrode;
a third transistor disposed on the substrate and including a third active pattern and a third gate electrode; and
a capacitor including a first terminal connected to the first gate electrode, and a second terminal connected to the third transistor, wherein
the lower pattern has a planar area that is greater than a planar area of the first active pattern and overlaps an entirety of the first active pattern, and
the lower pattern includes a portion that does not overlap the first active pattern in a plan view.

2. The display device of claim 1, wherein
the third active pattern is spaced apart from the first active pattern, and
the third active pattern does overlap the lower pattern.

3. The display device of claim 2, further comprising:
a second conductive layer including the first gate electrode; and a third conductive layer disposed in a different layer from the first conductive layer and the second conductive layer, wherein the first active pattern includes a first channel region, a first source region and a first drain region, the third active pattern includes a third channel region, a third source region and a third drain region, and the first drain region and the third source region are electrically connected to each other through the third conductive layer.

4. The display device of claim 3, further comprising:

a first insulating layer disposed on the second conductive layer, wherein the third conductive layer includes a capacitor electrode as the second terminal, the capacitor electrode being disposed on the first insulating layer, and the capacitor electrode is electrically connected to the first drain region and the third source region.

5. The display device of claim 4, wherein the capacitor electrode overlaps the first gate electrode to form the capacitor.

6. The display device of claim 5, wherein the capacitor electrode is electrically connected to the lower pattern.

7. The display device of claim 6, further comprising:

a second insulating layer disposed on the third conductive layer;

a pixel electrode layer including a pixel electrode disposed on the second insulating layer; and an emission layer disposed on the pixel electrode, wherein the pixel electrode is electrically connected to the capacitor electrode.

8. The display device of claim 7, wherein the second active pattern is spaced apart from the first and third active patterns, the third conductive layer further includes a driving voltage line and a data line, the first source region of the first active pattern is electrically connected to the driving voltage line, and the second active pattern includes a second source region electrically connected to the data line.

9. The display device of claim 7, further comprising:

a fourth conductive layer disposed between the second insulating layer and the pixel electrode layer, and the fourth conductive layer further includes a driving voltage line and a data line.

10. The display device of claim 7, wherein the third conductive layer further includes a driving voltage line and a data line.

11. The display device of claim 1, wherein the third active pattern is connected to the first active pattern.

* * * * *